(12) United States Patent
Tanaka

(10) Patent No.: US 9,042,196 B2
(45) Date of Patent: May 26, 2015

(54) MEMORY SYSTEM AND METHOD OF CONTROLLING MEMORY SYSTEM

(71) Applicant: Kabushiki Kaisha Toshiba, Minato-ku (JP)

(72) Inventor: Hiroaki Tanaka, Hadano (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/083,860

(22) Filed: Nov. 19, 2013

(65) Prior Publication Data

US 2015/0023101 A1    Jan. 22, 2015

Related U.S. Application Data

(60) Provisional application No. 61/856,414, filed on Jul. 19, 2013.

(51) Int. Cl.
| | |
|---|---|
| *G11C 5/14* | (2006.01) |
| *G11C 16/30* | (2006.01) |
| *G11C 16/04* | (2006.01) |
| *G06F 1/32* | (2006.01) |

(52) U.S. Cl.
CPC ............. *G11C 16/30* (2013.01); *G11C 16/04* (2013.01); *G06F 1/3203* (2013.01); *G06F 1/3234* (2013.01); *G06F 2212/1028* (2013.01)

(58) Field of Classification Search
CPC ...... G11C 16/30; G11C 16/04; G06F 1/3234; G06F 1/3203
USPC ................................. 365/227, 226
See application file for complete search history.

(56) References Cited

U.S. PATENT DOCUMENTS

| | | | | | |
|---|---|---|---|---|---|
| 5,584,031 | A * | 12/1996 | Burch et al. | ................... | 713/323 |
| 5,848,014 | A * | 12/1998 | Yukshing | ....................... | 365/227 |
| 6,088,290 | A * | 7/2000 | Ohtake et al. | ............ | 365/189.05 |
| 6,166,991 | A * | 12/2000 | Phelan | ..................... | 365/233.15 |
| 6,448,057 | B1 * | 9/2002 | Gong et al. | .................... | 435/194 |
| 6,457,095 | B1 * | 9/2002 | Volk | .............................. | 711/105 |
| 7,002,870 | B2 * | 2/2006 | Hsu | ................. | 365/227 |
| 7,079,441 | B1 * | 7/2006 | Partsch et al. | ................. | 365/226 |
| 7,386,656 | B2 * | 6/2008 | Rajan et al. | .................... | 711/103 |
| 7,418,612 | B2 * | 8/2008 | Do | ................. | 713/323 |
| 7,724,602 | B2 * | 5/2010 | Hur et al. | ....................... | 365/226 |
| 8,127,153 | B2 * | 2/2012 | Kapil | ............................. | 713/300 |
| 8,130,586 | B2 * | 3/2012 | Fujioka et al. | ................ | 365/222 |
| 8,386,818 | B2 * | 2/2013 | Hong | ............................. | 713/320 |
| 8,573,782 | B2 * | 11/2013 | Soma et al. | ..................... | 353/85 |
| 8,612,779 | B2 * | 12/2013 | More et al. | .................... | 713/300 |
| 8,624,627 | B1 * | 1/2014 | Jarrar et al. | ..................... | 326/41 |
| 2001/0000995 | A1 * | 5/2001 | Phelan | ......................... | 365/233 |
| 2007/0143539 | A1 * | 6/2007 | Ichikawa | ....................... | 711/113 |
| 2010/0275050 | A1 * | 10/2010 | Hong | ............................ | 713/324 |
| 2013/0151755 | A1 * | 6/2013 | Elhamias et al. | ............. | 711/103 |

OTHER PUBLICATIONS

"Device Sleep", Sponsors: SanDisk, Samsung, Intel, Microsoft, Proposed Draft Serial ATA International Organization, Serial ATA Technical Proposal: SATA31_TPR_C108, Oct. 24, 2011, 16 pages.

* cited by examiner

*Primary Examiner* — Viet Q Nguyen
(74) *Attorney, Agent, or Firm* — Oblon, McClelland, Maier & Neustadt, L.L.P.

(57) ABSTRACT

According to one embodiment, a low power direction received from a host device is delayed for a first predetermined time and is output as a first signal, and an internal state is caused to transition to a low power consumption mode that corresponds to the low power direction when a second predetermined time has elapsed after the first signal is asserted.

16 Claims, 6 Drawing Sheets

MEMORY SYSTEM AND METHOD OF CONTROLLING MEMORY SYSTEM

CROSS-REFERENCE TO RELATED APPLICATIONS

This application is based upon and claims the benefit of priority from U.S. Provisional Patent Application No. 61/856,414, filed on Jul. 19, 2013; the entire contents of which are incorporated herein by reference.

FIELD

Embodiments described herein relate generally to a memory system including a non-volatile semiconductor memory, and a method of controlling the memory system.

BACKGROUND

With a storage device mounted on a portable apparatus, restrictions on power consumption are severe due to being driven by a battery. Especially, a lower power consumption when no access is being made to a storage, that is, during standby, is highly preferred. In a state during the standby in a low power consumption mode, there are several stages according to easiness of recovery upon a subsequent occasion when an access becomes necessary. Among such, in a low power consumption mode with the least power consumption aside from power being off, power of almost all components, such as a communication link, as well as a volatile main storage, a processor, an oscillation circuit and the like on a storage device side, is turned off. Due to this, management information that is necessary for the recovery when a host restarted accessing is saved from a volatile main storage to a non-volatile auxiliary storage device before transitioning to the low power consumption mode.

Although transition and recovery to and from the low power consumption mode need to be performed promptly, the management information that should be saved is quite large. Due to this, a flash memory, such as of a NAND type, that is cheap and has relatively fast read performance is suitable as the auxiliary storage device. However, a flash memory is a memory device with a limited number of rewrites, and damages such as a write failure and a data read error occur when a large number of rewrite operations has been performed.

Due to this, in a case where a transition order to the low power consumption mode is frequently given from a host side, an amount of the power consumption increases to the contrary due to repeated transitions and recoveries to and from the low power consumption mode. Further, the flash memory is worn out by the frequent occurrences of rewrites in the flash memory.

DETAILED DESCRIPTION

In general, according to one embodiment, the memory system includes a non-volatile semiconductor memory, a volatile semiconductor memory, a controller, and a delay unit. The non-volatile semiconductor memory includes a plurality of blocks that are units of data erasing. The controller controls storing of data from a host device in the non-volatile semiconductor memory by using management information stored in the volatile semiconductor memory. The delay unit delays a low power direction received from the host device for a first predetermined time, and outputs the same as a first signal. The controller causes an internal state to transition to a low power consumption mode corresponding to the low power direction when a second predetermined time has elapsed after the first signal is asserted.

Exemplary embodiments of the memory system and a method of controlling the memory system will be explained below in detail with reference to the accompanying drawings. The present invention is not limited to the following embodiments.

First Embodiment

Figure 1:
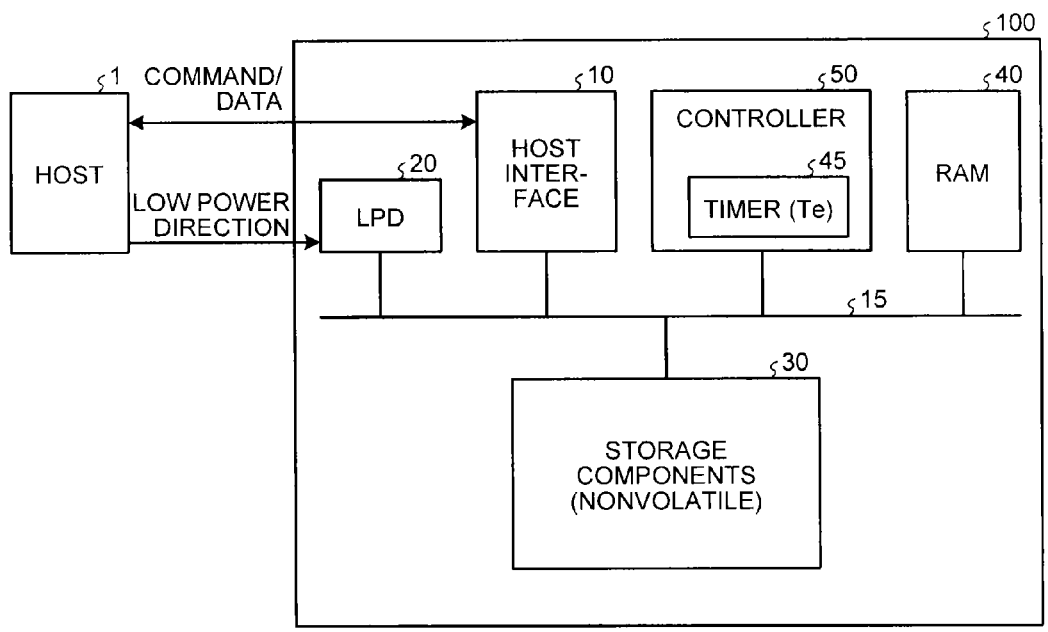
FIG. 1 is a functional block diagram showing an internal configuration of a first embodiment of the memory system.

FIG. 1 is a block diagram showing a configurational example of a memory system 100. The memory system 100 is connected to a host 1, such as a CPU, mounted on a portable apparatus, and functions as an external storage device of the host 1. The memory system 100 includes a host interface 10, a LPD (Low Power Direction Detector) 20, storage components 30 that are non-volatile semiconductor memories and that are configured of a flash memory such as of a NAND type, a RAM 40 that is a volatile semiconductor memory capable of faster access than the storage components 30, a controller 50 including a timer 45, and a bus 15.

The host interface 10 performs communication of commands, data, and status reports with the host 1.

The Low Power Direction Detector (LPD) 20 receives a low power direction from the host 1, and converts the received low power direction into a signal inside the memory system 100 and outputs the converted signal to the bus 15. In a case where a Serial ATA is employed as the host interface 10, the low power direction is termed a DEVSLP (Device Sleep). Note that the LPD 20 may be integrated into the controller 50.

The storage components 30 are non-volatile semiconductor memories and are, for example, configured of a NAND type flash memory. The storage components 30 store user data designated by the host 1. The storage components 30 back up management information managed by the RAM 40 by storing the same. The NAND type flash memory includes a memory cell array in which a plurality of memory cells is arranged in a matrix pattern. The NAND type flash memory is configured of a plurality of memory chips, and each memory chip is configured by arranging a plurality of blocks being units of data erasing. Further, in the NAND type flash memory, data write and data read are performed for each page. A block is configured of a plurality of pages.

The RAM 40 includes a storage region for storing and updating the management information for managing the memory system 100. As the management information, a mapping table that shows a relationship of logic addresses designated by the host 1 and storage locations (physical addresses)

in the storage components 30 is provided. In a case of configuring the storage components 30 by the flash memory, the management information includes used/unused block information indicating whether each block in the NAND type flash memory is being used or not being used, block management information for managing bad blocks that cannot be used as a storage region due to having too many errors, and the like. As the RAM 40, volatile SRAM (Static Random Access Memory), DRAM (Dynamic Random Access Memory), and the like are employed. The management information managed by such a RAM 40 is managed information stored in the storage components 30 having been developed upon startup or the like.

A storage region as a write buffer for temporarily storing data upon writing data from the host 1 in the storage components 30, and a storage region as a read buffer for temporarily storing the data read out from the storage components 30 according to a read request from the host 1 may be provided in the RAM 40.

The controller 50 controls operations of the memory system 100 such as write control of data to which a write request has been made from the host 1, and a read control of data to which the read request has been made from the host 1. The controller 50 includes the timer 45, and the controller 50 has a function of measuring time by the timer 45.

A relationship of the management information in the storage components 30 and the management information in the RAM 40 will be described. Transmission of data between the host 1 and the storage components 30 is enabled by the management information managed by the RAM 40. Upon the startup, the management information stored in the storage components 30 is developed in the RAM 40, and the management information in the RAM 40 is updated by the controller 50 using the developed management information. The management information in the RAM 40 needs to be restored to a state prior to the power-off when the power is turned off, thus the management information in the RAM 40 is stored in the storage components 30.

In the memory system 100, in a case where the low power direction represented by the DEVSLP is input from the host 1, the controller 50 causes an internal state to transition to a low power consumption mode by performing the following operation.

(1) Store the management information managed in the RAM 40 in the storage components 30 to back up the management information.

(2) Turn off the power of circuit components such as the host interface 10, the RAM 40, the controller 50, and an oscillation circuit (not shown), and transition to the low power consumption mode.

Accordingly, the management information managed in the RAM 40 is backed up in the storage components 30 by storing the same before being transitioned to the low power consumption mode. Therefore, if the low power direction from the host 1 is frequently given, the flash memory is worn out by the rewrites in the flash memory, and an amount of power consumption increases to the contrary.

Figure 2:
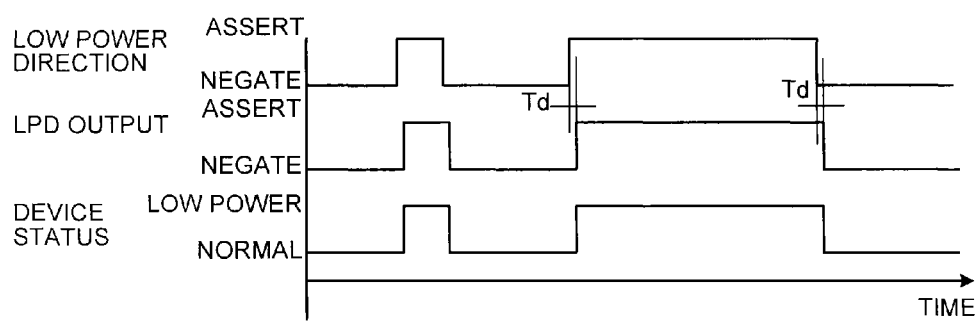
FIG. 2 is a time chart for explaining an operation of a comparative example.

FIG. 2 shows an operation of a comparative example when the low power direction is received from the host 1. When the low power direction is asserted, an LPD delays the low power direction for a delay time (Td) that is required to remove noises from a signal. Due to this, an LPD output that is an output from the LPD is asserted after the assertion of the low power direction, when the time Td has elapsed. Similarly, in a case where the low power direction is negated, the LPD output is negated after the negation of the low power direction when the time Td has elapsed. Td in the Serial ATA is termed DMDT (DEVSLP Minimum Detection Time), and time thereof is 10 μs. When the LPD output is asserted, a controller immediately stores management information managed by a RAM 40 in storage components 30, and thereafter causes an internal state of a memory system to transition to the low power consumption mode. Further, when the LPD output is negated, the controller immediately causes the inside of the memory system to return to a normal mode.

Figure 3:
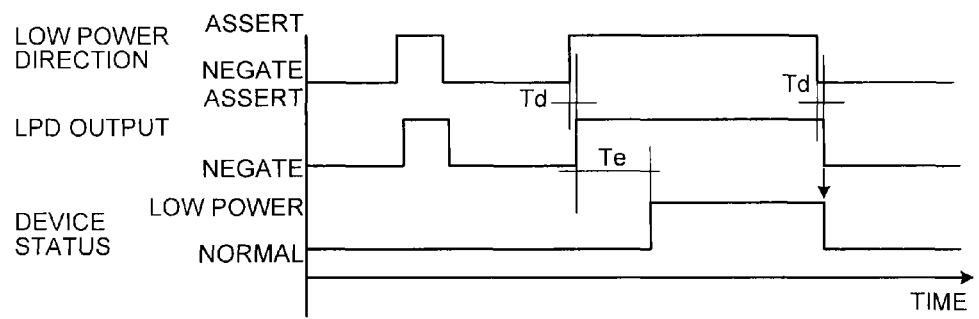
FIG. 3 is a time chart for explaining an operation of the first embodiment.

FIG. 3 is a time chart showing an operation of the memory system 100 in the first embodiment. When the low power direction is asserted, the LPD 20 delays the low power direction for the delay time (Td) that is required to remove noises from a signal, similar to the comparative example shown in FIG. 2. When the assertion of the LPD output is detected, the controller 50 starts the timer 45. Then, the controller 50 does not allow the memory system 100 to transition to the low power consumption mode until the timer 45 counts a predetermined time Te. Te>Td is satisfied. Note that, an operation upon returning from the low power consumption mode to the normal mode is identical to that of the comparative example, and the memory system is returned to the normal mode immediately when the LPD output is negated.

Since such a control is performed, in the case of the low power direction for the first time as shown in FIG. 3, the low power direction for the first time is ignored and the transition to the low power consumption mode is not performed due to an assertion period being short. In the case of low power direction for the second time, the transition to the low power consumption mode is performed due to the assertion period being long.

Figure 4:
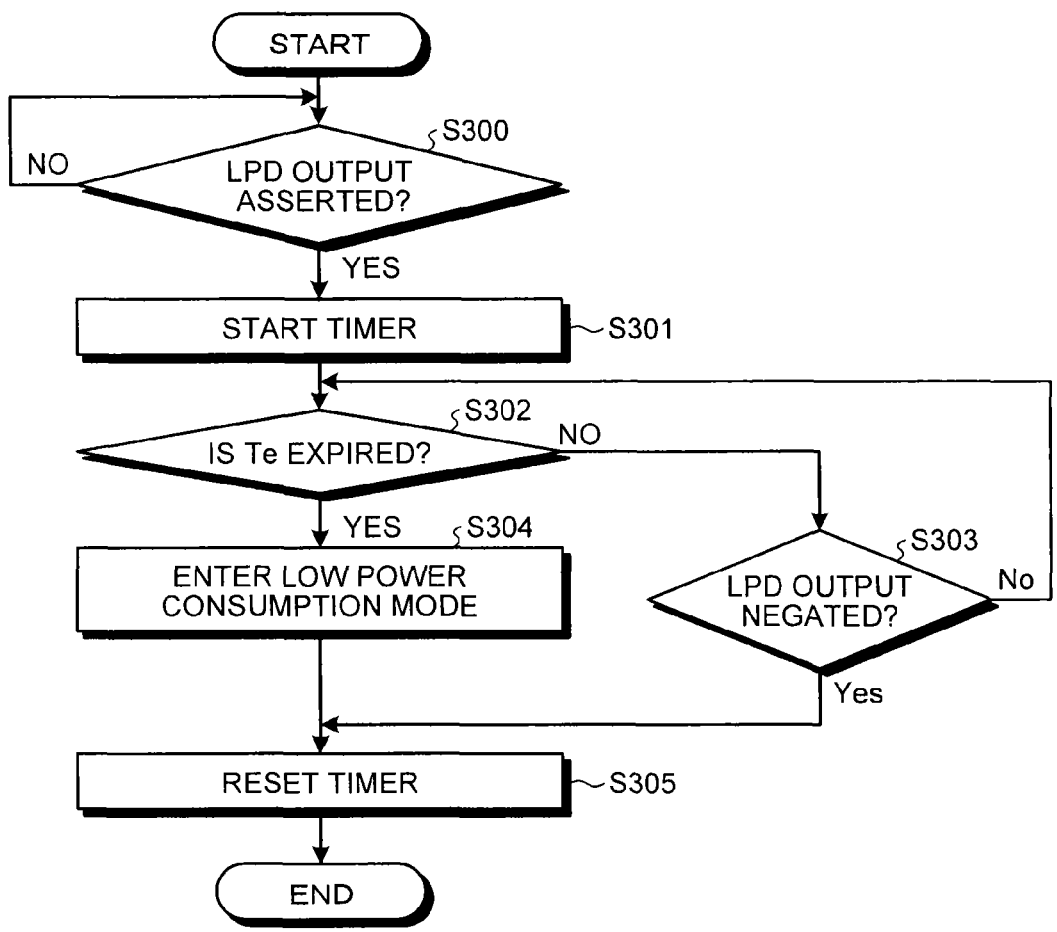
FIG. 4 is a flowchart for explaining the operation of the first embodiment.

FIG. 4 is a flowchart showing an operation procedure of the controller 50 in the first embodiment. When the low power direction is asserted, the LPD 20 delays the low power direction for the delay time (Td) that is required to remove the noises from the signal. When the LPD output that is a delayed output from the LPD 20 is asserted (step S300), the controller 50 activates the timer 45 to start measuring time (step S301). The controller 50 determines whether the time measured by the timer 45 has exceeded the predetermined delay time Te or not (step S302), and determines whether the LPD output is negated or not in a case where the delay time Te has not elapsed (step S303). In a case where the LPD output is negated, the controller 50 stops and resets the timer 45 (step S305), and ends the process. In step S303, in a case where the LPD output is not negated, the controller 50 returns the procedure to step S302, and repeats the determination on the expiry of the time Te and the determination on the LPD output having been negated or not until the time Te elapses.

When it is determined that the time measured by the timer 45 has exceeded the predetermined delay time Te (step S302: Yes), the controller 50 immediately stores the management information managed in the RAM 40 in the storage components 30, and thereafter causes the memory system 100 to transition to the low power consumption mode from the current normal mode (step S304). Thereafter, the controller 50 stops and resets the timer 45 (step S305), and ends the process.

Accordingly, in the first embodiment, after the LPD output is asserted, and in a case where the predetermined delay time Te has elapsed, the management information managed in the RAM 40 is stored in the storage components 30, and thereafter causes the memory system 100 to transition to the low power consumption mode. In other words, the transition to the low power consumption mode is not allowed until the predetermined delay time Te has elapsed, and also, the transition to the low power consumption mode is not allowed in the case where the LPD output is negated during a period from the assertion of the LPD output until the predetermined delay time Te has elapsed. Due to this, in the first embodiment, even in a case where the Low power direction frequently repeats the assertion and the negation, the number of the transitions to the low power consumption state can be reduced, the number of rewrites in the flash memory can be reduced, and the amount of the power consumption can be cut down.

Second Embodiment

In the second embodiment, a predetermined delay time (waiting time) Tc having elapsed since a command is received just before an LPD output is asserted is added to conditions for transitioning to a low power consumption mode. In the second embodiment, the transition to the low power consumption mode is performed at either a first point in time when a waiting time Te has elapsed since the LPD output is asserted, or a second point in time when a waiting time Tc has elapsed since a command is received just before the point in time when the LPD output is asserted, whichever arrives at a later timing. Tc>Te is satisfied.

Figure 5:
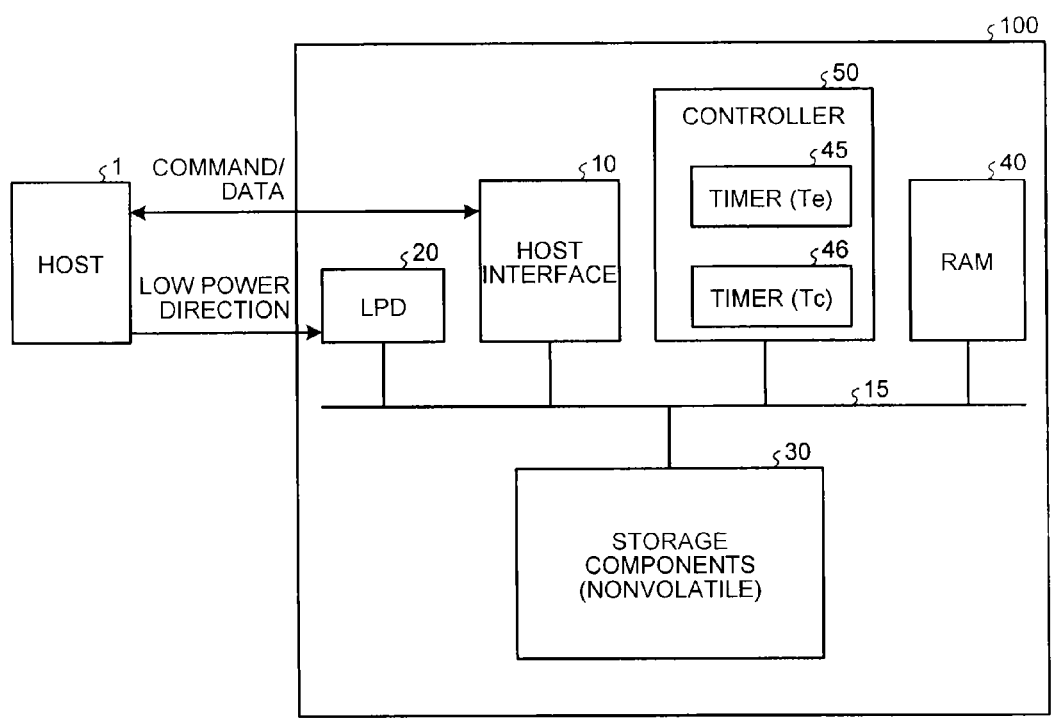
FIG. 5 is a functional block diagram showing an internal configuration of a second embodiment of the memory system.

FIG. 5 is a block diagram showing a configuration of a memory system 100 in the second embodiment. In FIG. 5, a timer 46 is added to the configuration of FIG. 4. The timer 46 measures an elapsed time since a command other than a low power direction was received. The timer 46 is reset by a controller 50 each time the command is received from a host 1, and its time measuring operation is restarted at a point in time when the command is received. Also in the second embodiment, an LPD 20 delays the low power direction from the host 1 by a delay time (Td).

Figure 6:
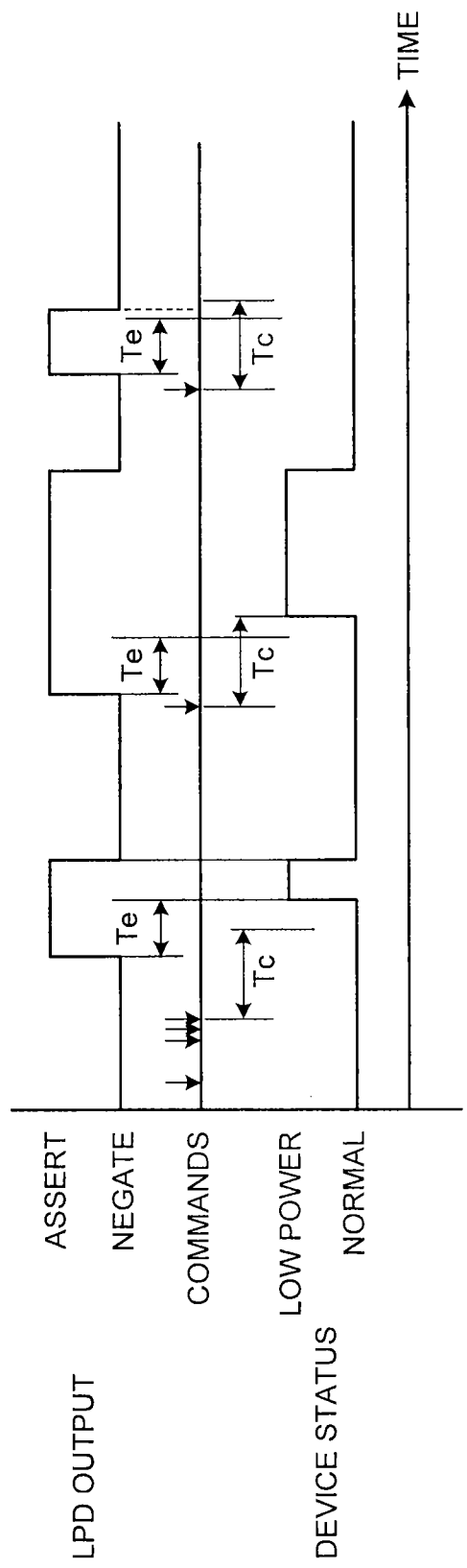
FIG. 6 is a time chart for explaining an operation of the second embodiment.

FIG. 6 is a time chart showing an operation of the memory system 100 in the second embodiment. In FIG. 6, a waiting time from the assertion of the LPD output until transitioning to the low power consumption mode is indicated by Te, similar to FIG. 3. Further, a timing of receiving a command from the host 1 is indicated by a downward arrow. A waiting time from the point in time when the command is received just before the LPD output is asserted until transitioning to the low power consumption mode is indicated by Tc.

In the second embodiment, the transition to the low power consumption mode is performed at either the first point in time when a timer 45 measures the waiting time (delay time) Te after the LPD output is asserted, or the second point in time when the timer 46 measures the waiting time (delay time) Tc after the command is received just before the point in time when the LPD output is asserted, whichever arrives at the later timing.

Figure 7:
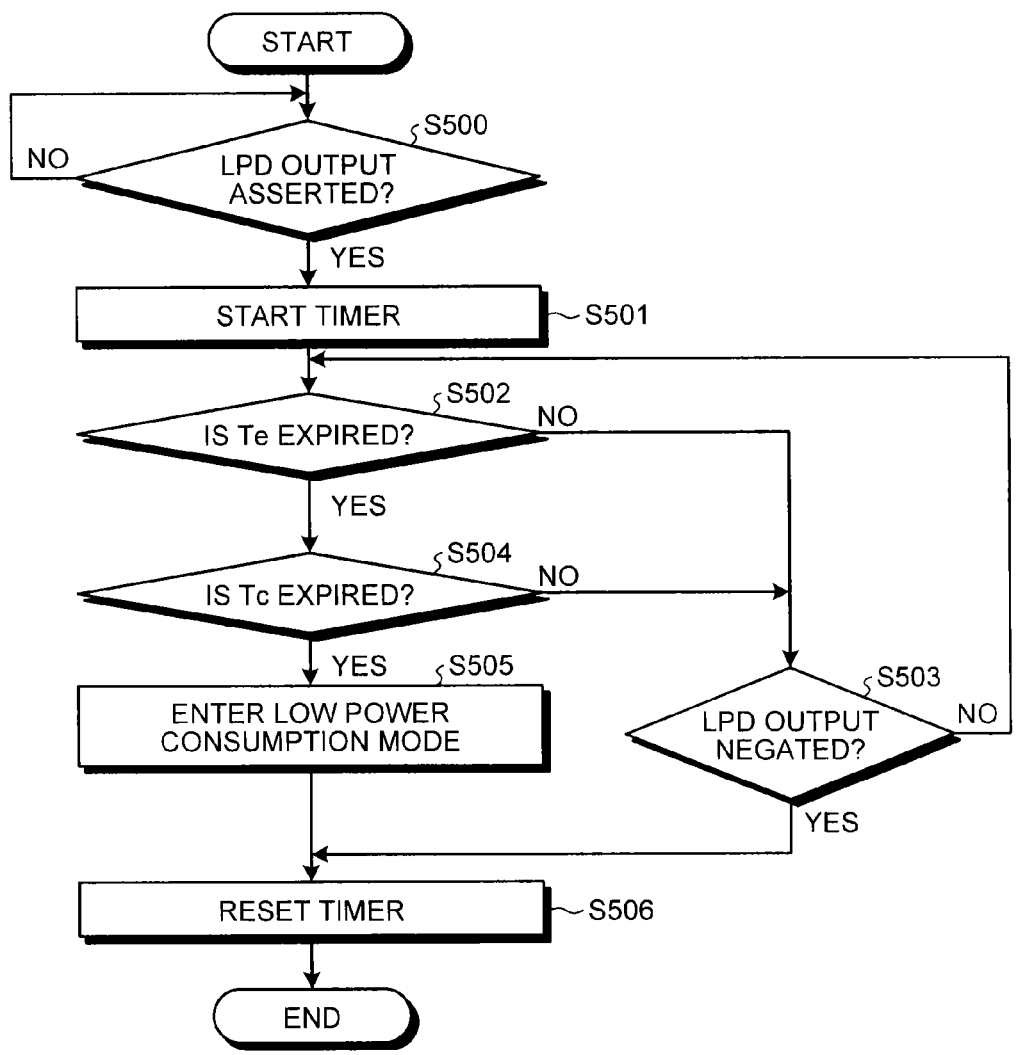
FIG. 7 is a flowchart for explaining the operation of the second embodiment.

FIG. 7 is a flow chart showing an operation procedure of the controller 50 in the second embodiment. When the low power direction from the host 1 is asserted, the LPD 20 delays the low power direction by the delay time Td. When the LPD output that is the delayed output from the LPD 20 is asserted (step S500), the controller 50 activates the timer 45 to start measuring time (step S501). The controller 50 determines whether the time measured by the timer 45 has exceeded the predetermined delay time Te or not (step S502), and determines whether the LPD output is negated or not in a case where the delay time Te has not elapsed (step S503). In a case where the LPD output is negated, the controller 50 stops and resets the timer 45 (step S506), and ends the process. In step S503, in a case where the LPD output is not negated, the controller 50 returns the procedure to step S502, and further repeats the determination on the expiry of the time Te and the determination on the LPD output having been negated or not until the time Te elapses.

When it is determined that the time measured by the timer 45 has exceeded the predetermined delay time Te (step S502: Yes), the controller 50 determines whether the time measured by the timer 46 has exceeded the predetermined delay time Tc or not (step S504). Note that, as described earlier, the timer 46 is reset each time the command is received, and restarts the time measuring operation at the point in time of the reset. Further, once the low power direction is asserted, a new command will not be issued from the host 1 until the low power direction is negated. Due to this, in the determination of step S504, a determination is made on whether the elapsed time from the point in time when the command is received just before the point in time when the LPD output is asserted exceeds the predetermined delay time Tc or not.

In the determination of step S504, in a case where the time measured by the timer 46 does not exceed the predetermined delay time Tc, the controller 50 determines whether the LPD output has been negated or not (step S503). In a case where the LPD output is negated, the controller 50 stops and resets the timer 45 and the timer 46 (step S506), and ends the process. In step S503, in a case where the LPD output is not negated, the controller 50 returns the procedure to step S502, and repeats the determination on the expiry of the time Tc and the determination on the LPD output having been negated or not until the time To elapses.

When it is determined that the time measured by the timer 46 has exceeded the predetermined delay time Tc (step S504: Yes), the controller 50 immediately stores management information managed in a RAM 40 in storage components 30, and thereafter causes the memory system 100 to transition to the low power consumption mode from a current normal mode (step S505). Thereafter, the controller 50 stops and resets the timer 45 and the timer 46 (step S506), and ends the process.

In FIG. 6, in a case of the low power direction (LPD output) for the first time, the transition to the low power consumption mode is performed from the point in time when the timer 45 finished measuring the delay time Te, since the point in time when the timer 45 finished measuring the delay time Te is later than the point in time when the timer 46 finished measuring the delay time Tc. In a case of the low power direction (LPD output) for the second time, the transition to the low power consumption mode is performed from the point in time when the timer 46 finished measuring the delay time Tc, since the point in time when the timer 46 finished measuring the delay time Tc is later than the point in time when the timer 45 finished measuring the delay time Te. In a case of the low power direction (LPD output) for the third time, the timer 46 has not yet finished measuring the delay time Tc at the time when the timer 45 finished measuring the delay time Te. Further, the timer 46 has finished measuring the delay time Tc after the LPD output is negated. Due to this, in the case of the low power direction (LPD output) for the third time, the transition to the low power consumption mode is not performed.

Accordingly, in the second embodiment, the transition to the low power consumption mode is performed at either the first point in time when the waiting time Te has elapsed since the LPD output is asserted, or the second point in time when the waiting time Tc has elapsed since the command is received just before the point in time when the LPD output is asserted, whichever arrives at the later timing. Due to this, in the second embodiment, the transition to the low power consumption mode does not take place since the LPD output is asserted until Te or Tc has elapsed. Accordingly, in the second embodiment, even in a case where the Low power direction frequently repeats the assertion and the negation, the number of the transitions to the low power consumption state can be reduced, a number of rewrites in a flash memory can be reduced, and an amount of power consumption can be cut down.

Generally, the host 1 is highly likely to issue a subsequent command for a while after having issued a command. Due to this, in the second embodiment, standby takes place without transitioning to the low power consumption state during the predetermined time Tc after the command is issued. Accordingly, in the second embodiment, the subsequent command can be received without transitioning to the low power consumption state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile semiconductor memory including a plurality of blocks being a unit of data erasing;
   a volatile semiconductor memory;
   a controller configured to control storing of data from a host device in the non-volatile semiconductor memory by using management information stored in the volatile semiconductor memory; and
   a delay unit configured to delay a low power direction received from the host device for a first predetermined time and output the low power direction as a first signal,
   wherein the controller causes an internal state to transition to a low power consumption mode corresponding to the low power direction when a second predetermined time has elapsed after the first signal is asserted.

2. The memory system according to claim 1, wherein, in a case where the first signal is negated before the second predetermined time has elapsed, the controller does not allow the internal state to transition to the low power consumption mode.

3. The memory system according to claim 1, wherein, in a case where the first signal is negated after having transitioned to the low power consumption mode, the controller immediately causes the internal state to transition from the low power consumption mode to a normal mode.

4. The memory system according to claim 1, wherein, in the low power consumption mode, the controller shuts off power to the volatile semiconductor memory after having stored the management information stored in the volatile semiconductor memory in the non-volatile semiconductor memory.

5. The memory system according to claim 1, wherein the controller causes the internal state to transition to the low power consumption mode at either a first point in time when the second predetermined time has elapsed since the first signal is asserted, or a second point in time when a third predetermined time has elapsed since a command is received, whichever arrives at a later timing, the command being other than the low power direction that had been received just before the first signal is asserted.

6. The memory system according to claim 2, wherein the controller causes the internal state to transition to the low power consumption mode at either a first point in time when the second predetermined time has elapsed since the first signal is asserted, or a second point in time when a third predetermined time has elapsed since a command is received, whichever arrives at a later timing, the command being other than the low power direction that had been received just before the first signal is asserted.

7. The memory system according to claim 3, wherein the controller causes the internal state to transition to the low power consumption mode at either a first point in time when the second predetermined time has elapsed since the first signal is asserted, or a second point in time when a third predetermined time has elapsed since a command is received, whichever arrives at a later timing, the command being other than the low power direction that had been received just before the first signal is asserted.

8. The memory system according to claim 4, wherein the controller causes the internal state to transition to the low power consumption mode at either a first point in time when the second predetermined time has elapsed since the first signal is asserted, or a second point in time when a third predetermined time has elapsed since a command is received, whichever arrives at a later timing, the command being other than the low power direction that had been received just before the first signal is asserted.

9. A method of controlling a memory system comprising a non-volatile semiconductor memory including a plurality of blocks being a unit of data erasing and in which data from a host device is stored, and a volatile semiconductor memory in which management information is stored, the method comprising:
   delaying a low power direction received from the host device for a first predetermined time and outputting the low power direction as a first signal; and
   causing an internal state to transition to a low power consumption mode corresponding to the low power direction when a second predetermined time has elapsed after the first signal is asserted.

10. The method of controlling a memory system according to claim 9, wherein, in a case where the first signal is negated before the second predetermined time has elapsed, the internal state is not allowed to transition to the low power consumption mode.

11. The method of controlling a memory system according to claim 9, wherein, in a case where the first signal is negated after having transitioned to the low power consumption mode, the internal state is immediately caused to transition from the low power consumption mode to a normal mode.

12. The method of controlling a memory system according to claim 9, wherein, in the low power consumption mode, power to the volatile semiconductor memory is shut off after having stored the management information stored in the volatile semiconductor memory in the non-volatile semiconductor memory.

13. The method of controlling a memory system according to claim 9, wherein the internal state is caused to transition to the low power consumption mode at either first point in time when the second predetermined time has elapsed since the first signal is asserted, or a second point in time when a third predetermined time has elapsed since a command is received, whichever arrives at a later timing, the command being other than the low power direction that had been received just before the first signal is asserted.

14. The method of controlling a memory system according to claim 10, wherein the internal state is caused to transition to the low power consumption mode at either a first point in time when the second predetermined time has elapsed since the first signal is asserted, or a second point in time when a third predetermined time has elapsed since a command is received, whichever arrives at a later timing, the command being other than the low power direction that had been received just before the first signal is asserted.

15. The method of controlling a memory system according to claim 11, wherein the internal state is caused to transition to the low power consumption mode at either a first point in time when the second predetermined time has elapsed since the first signal is asserted, or a second point in time when a third predetermined time has elapsed since a command is received, whichever arrives at a later timing, the command being other than the low power direction that had been received just before the first signal is asserted.

16. The method of controlling a memory system according to claim 12, wherein the internal state is caused to transition to the low power consumption mode at either a first point in time when the second predetermined time has elapsed since the first signal is asserted, or a second point in time when a third predetermined time has elapsed since a command is received, whichever arrives at a later timing, the command being other than the low power direction that had been received just before the first signal is asserted.

* * * * *